United States Patent [19]
Patel et al.

[11] Patent Number: 5,430,611
[45] Date of Patent: Jul. 4, 1995

[54] SPRING-BIASED HEAT SINK ASSEMBLY FOR A PLURALITY OF INTEGRATED CIRCUITS ON A SUBSTRATE

[75] Inventors: Chandrakant Patel, Fremont; Hannsjörg Obermaier, Los Gotos, both of Calif.

[73] Assignee: Hewlett-Packard Company, Palo Alto, Calif.

[21] Appl. No.: 88,283

[22] Filed: Jul. 6, 1993

[51] Int. Cl.[6] ............................................. H05K 7/20
[52] U.S. Cl. .................................. 361/705; 257/724; 361/697; 361/719
[58] Field of Search ................ 428/323, 327, 328; 361/695, 697, 704, 705, 707, 706, 718, 719, 722, 749, 736; 257/706, 707, 713, 724, 727; 267/150, 160; 165/80.3, 185; 174/16.3, 52.1, 52.2

[56] References Cited

U.S. PATENT DOCUMENTS

| | | | |
|---|---|---|---|
| 3,593,064 | 7/1971 | Wagner et al. | 317/100 |
| 4,034,468 | 7/1977 | Koopman | 29/628 |
| 4,517,624 | 5/1985 | Wessely | 361/387 |
| 4,521,829 | 6/1985 | Wessely | 361/387 |
| 4,531,146 | 7/1985 | Cutchaw | 357/82 |
| 4,563,725 | 1/1986 | Kirby | 361/368 |
| 4,612,978 | 9/1986 | Cutchaw | 165/104.33 |
| 4,750,086 | 6/1988 | Mittal | 361/382 |
| 4,790,373 | 12/1988 | Raynor | 361/697 |
| 4,879,629 | 11/1989 | Tustaniwskyj et al. | 361/385 |
| 4,933,747 | 6/1990 | Schroeder | 357/82 |
| 4,964,458 | 10/1990 | Fint et al. | 165/80.4 |
| 5,065,279 | 11/1991 | Lazenby | 361/386 |
| 5,094,769 | 3/1992 | Anderson | 252/71 |
| 5,168,348 | 12/1992 | Chu et al. | 257/713 |
| 5,177,667 | 1/1993 | Graham et al. | 361/385 |
| 5,237,203 | 8/1993 | Massaron | 257/688 |
| 5,268,814 | 12/1993 | Yakubowski | 361/704 |

FOREIGN PATENT DOCUMENTS

| | | | |
|---|---|---|---|
| 368743A2 | 5/1900 | European Pat. Off. | |
| 0243710A2 | 11/1987 | European Pat. Off. | H01L 23/46 |
| 1055194 | 1/1967 | United Kingdom | 361/697 |

OTHER PUBLICATIONS

Darveaux et al., "Theraml Analysis of a Multi-Chip Package Design", Journal of Electronic Materials, vol. 18, No. 2, 1988, pp. 267-274.

Darveaux et al., "Backside Cooling of Flip Chip Devices in Multichip Modules", ICMCM Proceedings '92, pp. 230-241.

*Primary Examiner*—Gerald P. Tolin

[57] ABSTRACT

A spring-biased heat sink assembly for a multi-chip module that has several integrated circuit chips on a substrate. Thermal paste provides a thermal connection between a heat sink and the chips. A beam spring applies pressure to the back side of the substrate, maintaining a constant force that urges the chips against the heat sink and avoids mechanical stress that would otherwise result from lateral motion of the chips such as from differential expansion. A flat flexible cable connects the module with other circuitry.

14 Claims, 4 Drawing Sheets

SPRING-BIASED HEAT SINK ASSEMBLY FOR A PLURALITY OF INTEGRATED CIRCUITS ON A SUBSTRATE

The present invention relates generally to heat sinks for electronic components and more particularly to a heat sink assembly of the kind that utilizes a spring that presses on one side of a multi-chip module substrate to urge integrated circuit chips on the other side of the substrate into thermal contact with a heat sink.

Modern electronic appliances such as computers have many hundreds of integrated circuits and other electronic components, most of which are mounted on printed circuit boards. Many of these components generate heat during normal operation. Components that are relatively big or that have a relatively small number of functions in relation to their size, as for example individual transistors or small scale integrated circuits, usually dissipate all their heat without a heat sink. The large physical sizes of such components, especially as compared with their active portions, limits their density on a circuit board sufficiently that there is enough room for any heat sinks that may be needed. Accordingly, any component that needs assistance in dissipating heat can have a heat sink of its own.

The term "heat sink" as used herein generally refers to a passive device, for example an extruded aluminum plate with a plurality of fins, that is thermally coupled to an electronic component to absorb heat from the component. The heat sink dissipates this heat into the air by convection.

As the state of the electronic arts has advanced, components have become smaller and smaller, to the extent that many thousands of them are now combined into a single integrated circuit chip. In addition, components are being made to operate faster and faster to provide the computing power that is increasingly being required of computers and other electronic devices. As the operating speed increases, so does the amount of heat which the components must dissipate. These factors have made it more difficult for many components to dissipate the heat they generate without the assistance of external heat sinks. At the same time, the increasing component density has made it impractical to provide individual heat sinks for the increasing numbers of components that need them. Accordingly, it has become necessary for many components to share one heat sink.

One widely-used method of increasing the speed of an electronic circuit is to reduce the lengths of the connecting wires. In part, this is being done by abandoning the older practice of enclosing each integrated circuit chip in a separate package in favor of mounting many chips next to each other on a single substrate. Such an assembly of chips and substrate is commonly referred to as a multi-chip module ("MCM"). The chips on an MCM are too small, and usually must be located too near one another on the MCM, to permit the use of separate heat sinks for the individual chips. Accordingly, in order to dissipate the heat generated by the chips on an MCM, it is necessary to use a single heat sink.

In one type of MCM, each chip is mechanically fixed to a common heat sink, for example by solder or glue. The chips are connected to the substrate through flexible wires, for example by tape automated bonding ("TAB") techniques. If the chips move laterally relative to each other as a result of different rates of expansion of the chips and the heat sink, the flexible wiring absorbs the motion. Thus, relative lateral motion of the chips does not subject either the chips or their electrical connections to significant mechanical stress.

Flexible wires have drawbacks. One such drawback is the relative complexity of the wiring assembly. Another is that parasitic effects of the wires effectively limit the speed at which the overall device can operate. Accordingly, for many applications it is necessary to mount the chips directly on the substrate by means of solder bumps. This is known as "flip-chip" mounting.

One technique for cooling an MCM in which the chips are soldered directly onto the substrate is to thermally couple the heat sink to the opposite side of the substrate from the chips. The heat then travels from the chips, through the solder bumps and the substrate, and into the heat sink. This technique is often inadequate, especially if the MCM includes high-power chips.

Fixing a single heat sink on top of all the chips in an MCM by means of a thin layer of epoxy or solder is the simplest approach, but in high-power circuits this has not been satisfactory. The solder bumps that make the electrical connections between the chips and the substrate are the weakest mechanical link in the MCM. When the chips are rigidly coupled to the heat sink, differences between the coefficients of expansion of the chips and the heat sink result in lateral movement of the chips relative to each other as the chips and the heat sink warm up. This lateral expansion puts mechanical stresses on the solder bumps and ultimately leads to failure of the electrical connections. In addition, if it becomes necessary to service the MCM, for example to replace one of the chips, removing the heat sink so as to get access to the chips is very difficult.

An alternative is to couple the chips to the heat sink by thermal paste. This solves the differential expansion problem because the paste permits the chips and the heat sink to slide laterally relative to each other without putting any stress on the solder bumps. However, the chips often are not all the same height above the substrate, for example because the chips themselves are of different thicknesses or because of variations in solder bump height or in flatness of the substrate. To compensate for these variations in height, a relatively thick layer of paste must be used. The thermal conductivity of paste is not as good as that of solder, and the result is inadequate heat transfer when high-power chips are involved.

There have been many attempts to solve the problem of dissipating heat developed by high-power integrated circuit chips in an MCM. By way of example, some approaches to this problem are discussed in the following references: Darveaux and Turlik, "Backside Cooling of Flip Chip Devices in Multichip Modules", *ICMCM Proceedings*, 1992, pp. 230–241; European Patent no. EO 0 368 743 A2, "High Performance Integrated Circuit Chip Package and Method of Making Same", issued in the names of Turlik et al., May 16, 1990; U.S. Pat. No. 4,034,468, issued to Koopman on Jul. 12, 1977; U.S. Pat. No. 5,094,769, issued to Anderson, Jr., et al., on Mar. 10, 1992; and Darveaux et al., "Thermal Analysis of a Multi-Chip Package Design", *Journal of Electronic Materials*, Vol. 18, No. 2 (1989), pp. 267–274. Some of these solutions are mechanically complex, or are expensive, or make it difficult or impossible to rework or service the MCM. For these and other reasons, none of the prior approaches has adequately solved the problem.

From the foregoing it will be apparent that there is still a need for a way to adequately dissipate heat from all the integrated circuit chips in an MCM in the limited physical space that is available without imposing mechanical stresses that can lead to failure.

SUMMARY OF THE INVENTION

The present invention provides a heat sink assembly that adequately dissipates heat generated by all the chips in an MCM including very high-power chips without imposing mechanical stresses that can cause the MCM to fail. A heat sink assembly embodying the invention is mechanically simple, economical, easy to install, and easy to remove if it becomes necessary to service the MCM.

Briefly and in general terms, a heat sink assembly according to the invention includes a heat sink; thermal paste or the like to provide a thermal interface between integrated circuits on an MCM and the heat sink; and a spring or other source of mechanical bias that urges the MCM toward the heat sink and thereby presses the integrated circuits against the thermal interface with a force that remains substantially constant regardless of thermal expansion or contraction of any of the components.

Optionally a fan is mounted on the heat sink to improve the flow of air over the heat sink.

In a preferred embodiment a base plate is fastened to the heat sink. The base plate and the heat sink define a cavity that encloses the multi-chip module, the thermal interface and the spring. A flat flexible cable extends between the base plate and the heat sink to establish electrical communications between the multi-chip module and an external circuit. A beam spring is preferably used and is arranged to exert an expansive force between the substrate and the base plate, pushing the substrate away from the base plate and thereby toward the heat sink.

Other aspects and advantages of the invention will become apparent from the following detailed description, taken in conjunction with the accompanying drawings, illustrating by way of example the principles of the invention.

DESCRIPTION OF THE PREFERRED EMBODIMENT

Figure 1:
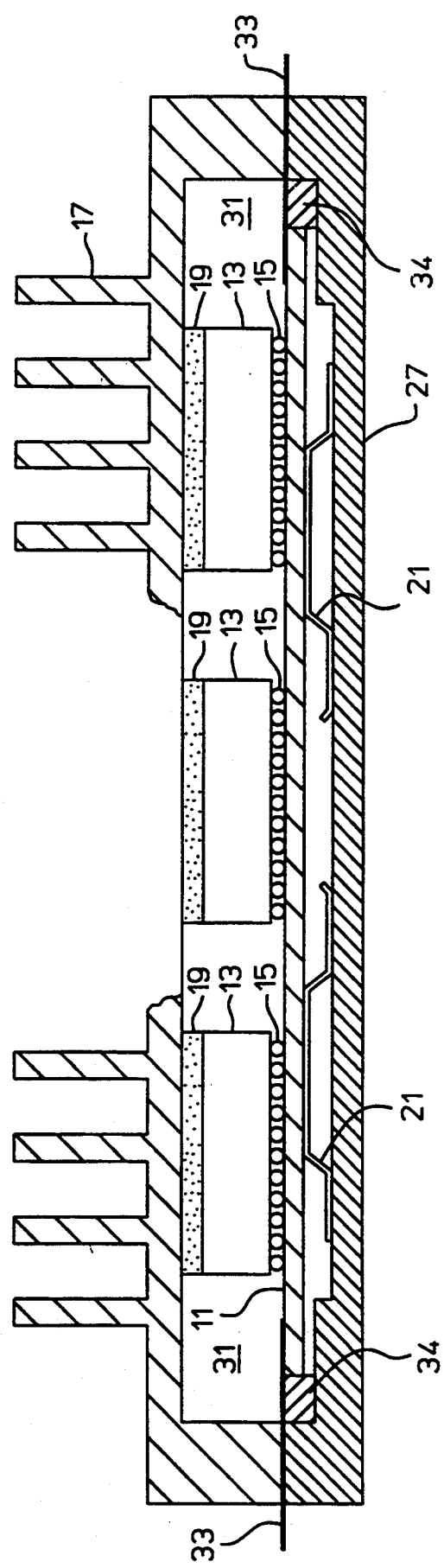
FIG. 1 is a cross-sectional view of a heat sink assembly according to the invention.

As shown in the drawings for purposes of illustration, the invention is embodied in a heat sink assembly that dissipates heat generated by all the chips in an MCM without imposing significant mechanical stress. Various ways of dissipating heat generated by the chips of an MCM have been tried, but these have resulted in mechanical stress from differential expansion and ultimate failure of the solder connections to the chips. Other attempts have been unduly costly or complex or have not adequately dissipated the heat from all the chips in a sufficiently limited physical space.

A heat sink assembly according to the invention includes a heat sink that is thermally coupled to the chips of an MCM by thermal paste or the like and a spring that presses the chips against the thermal interface with a force that remains substantially constant regardless of thermal expansion. This heat sink assembly is mechanically simple and economical, it is easy to install and exceptionally easy to remove for servicing the MCM, and it prevents mechanical stresses that otherwise could lead to solder bump failure. Although the invention finds a primary application in a cooling system for MCMs, it has applications in other types of heat transfer systems as well.

FIG. 1 illustrates a preferred embodiment of a heat sink assembly according to the invention. The heat sink assembly is illustrated in combination with an MCM (multi-chip module) of the kind having a substrate 11 and a plurality of integrated circuit chips 13 mounted on the substrate by means of solder bumps 15 or the like. The heat sink assembly includes a heat sink 17; a thermal interface 19 such as thermal paste between the integrated circuits and the heat sink, operative to conduct heat from the integrated circuits to the heat sink; and mechanical bias means (shown as beam springs 21) that urge the substrate toward the heat sink and thereby press the integrated circuits against the thermal interface with a force that remains substantially constant regardless of any thermal expansion or contraction of any of the substrate, the integrated circuits and the heat sink.

Various kinds of thermal paste are known and may be used for the thermal interface 19. In general, pastes comprising particles such as aluminum, aluminum nitride or silver in silicone oil have relatively good thermal conductivity (1.6 to 2.6 W/m-K) and have been found to give good results. One useful paste is further described in U.S. Pat. No. 5,094,769 (Anderson, Jr., et al.) mentioned above.

Figure 2:
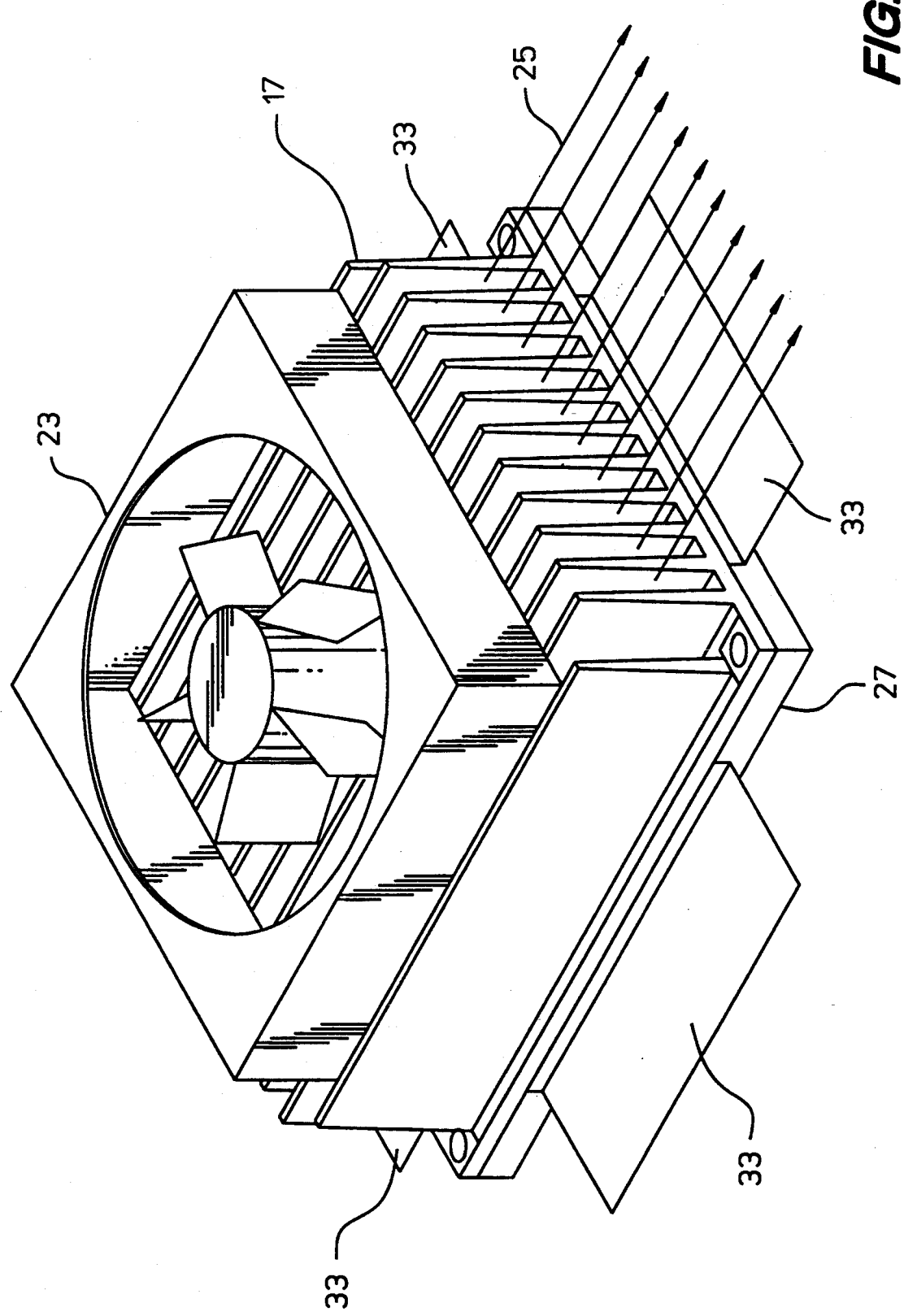
FIG. 2 is a perspective view of a heat sink assembly similar to that shown in FIG. 1 and with a fan attached to the heat sink.

Optionally, a fan 23 is mounted on the heat sink 17 as shown in FIG. 2 to cause air to flow over the heat sink, as indicated by arrows 25, to carry away heat at a greater rate than would occur without the fan. A 47.4 cfm fan made by Mitsubishi has been found to give satisfactory results when used with a heat sink having dimensions of 125 millimeters × 100 millimeters. The heat sink itself is preferably made of extruded aluminum or other suitable material.

Figure 3:
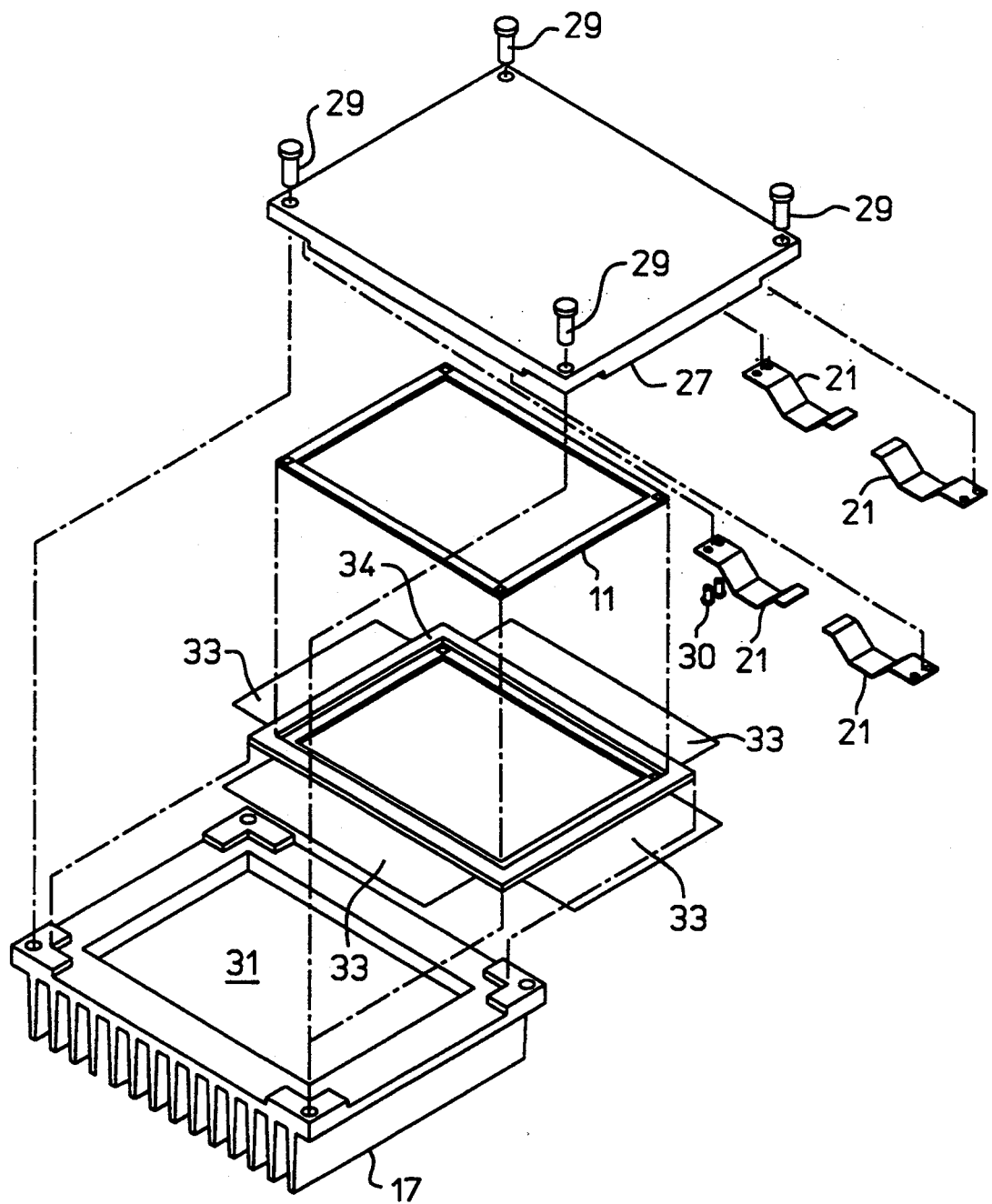
FIG. 3 is an exploded view of a heat sink assembly similar to that shown in FIG. 1.

Preferably the heat sink assembly includes a base plate 27 and a fastener such as screws 29 for fastening the base plate to the heat sink, as best shown in FIG. 3. The base plate and the heat sink together define a cavity 31 that encloses the multi-chip module, the thermal interface and the mechanical bias means.

In the embodiment shown, the mechanical bias means comprises beam springs 21 that exert an expansive force between the substrate and the base plate, pushing them apart and thereby pressing the substrate toward the heat sink. The springs 21 are attached to the base plate 27 with screws 30 or the like. The springs are preferably oriented with respect to the substrate to minimize any deformation of the substrate that might result from the exertion of force on the substrate by the springs. For example, the springs are preferably positioned beneath some of the chips, in particular any chips that have a larger surface area than others of the chips. It will be apparent that other kinds of springs or the like may be used for the mechanical bias means as may be convenient in a particular configuration.

Figure 4B:
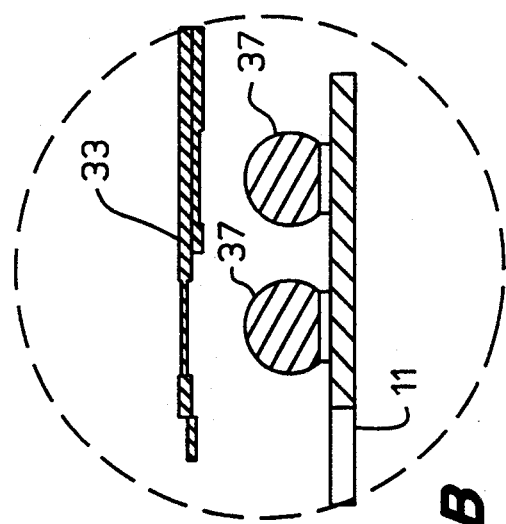
FIGS. 4a and 4b are diagrammatic views of a portion of a heat sink assembly similar to that shown in FIG. 1, illustrating the electrical connections between the substrate and an external circuit.
Figure 4A:
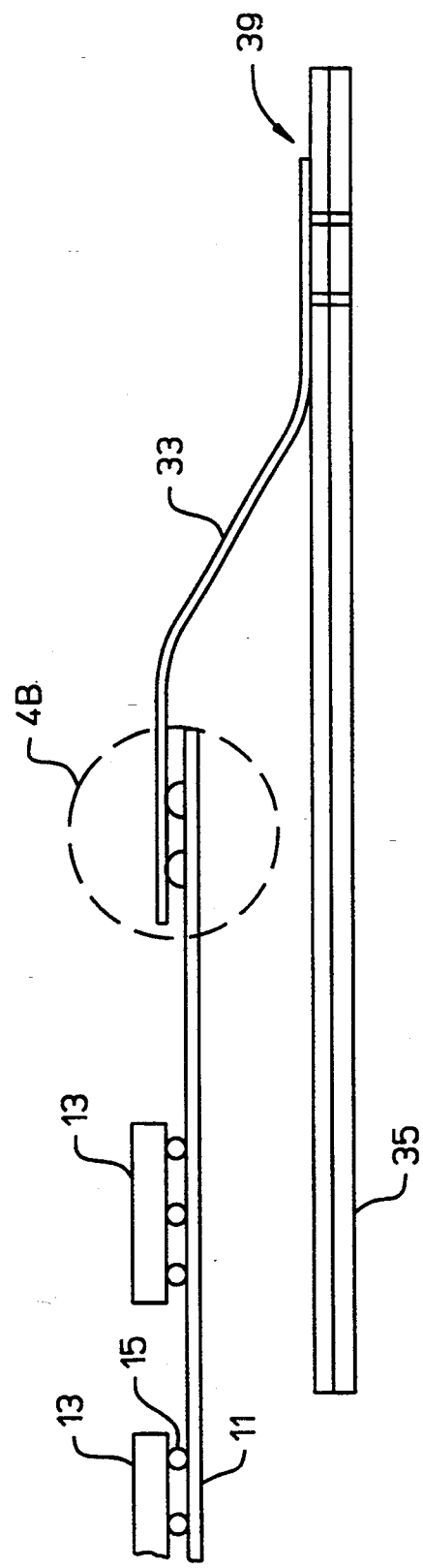

A flat flexible cable 33 supported by a frame 34 extends between the base plate 27 and the heat sink 17 to establish electrical communications between the multi-chip module and an external circuit such as a multi-layer printed circuit board 35. As shown in FIGS. 4a and 4b, the cable 33 is connected to the substrate 11 by means of solder bumps 37. The cable 33 is connected to the circuit board 35 by a gold-to-gold pressure connection 39. It will be apparent that other connection means may be used between the cable and either the substrate 11 or the circuit board 35 as may be convenient.

A microstrip flex circuit with a 50-ohm characteristic impedance, manufactured by Hughes Aircraft Co., is suitable for the cable 33. Power and ground connections may be established through a split plane layer (not shown) or other suitable means as desired.

The dimensions of the various elements are not critical and may be adjusted as desired according to such factors as the size and number of chips on the MCM and the thermal conductivities of the specific materials being used. Of course, optimum results will usually be obtained by making the thermal paste as thin as possible. For example, in one embodiment the thermal paste is about 0.2 millimeters thick.

The force which is exerted by the springs should be enough to maintain good thermal contact between the chips and the heat sink while permitting lateral sliding motion of the chips relative to the heat sink. The force must not be so great as to damage the chips or the solder bumps. The force is controlled by, for example, appropriate selection of material and shape of the springs. In one embodiment satisfactory results have been obtained by designing the springs to exert a force of about 0.3 Newtons per solder bump.

From the foregoing it will be appreciated that the heat sink assembly provided by the invention provides an efficient thermally conductive path between the chips on an MCM and a heat sink. The heat sink assembly is mechanically simple, easy to assemble, and exceptionally easy to remove if it becomes necessary to service the MCM. Mechanical stresses arising from lateral motion of the chips relative to each other, including those caused by differential expansion, are essentially eliminated, protecting the solder bump electrical connections between the chips and the substrate from premature failure.

Although certain embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A heat sink assembly combined with a multi-chip module having a substrate and a plurality of integrated circuits mounted on the substrate using solder bumps, the heat sink assembly comprising:
    a heat sink;
    a thermal interface between the integrated circuits and the heat sink, operative to conduct heat from the integrated circuits to the heat sink; and
    at least one pair of beam springs urging the substrate toward the heat sink and thereby pressing a non-input/output side of the integrated circuits against the heat sink via the thermal interface with a force that remains substantially constant regardless of any thermal expansion or contraction of any of the substrate, the integrated circuits and the heat sink.

2. A heat sink assembly as in claim 1 wherein the thermal interface comprises thermal paste.

3. A heat sink assembly as in claim 2 wherein the thermal paste comprises a mixture of silicone oil and particles selected from the group comprising silver, aluminum and aluminum nitride.

4. A heat sink assembly as in claim 1 and further comprising a fan mounted on the heat sink, operative to cause air to flow over the heat sink to carry away heat.

5. A heat sink assembly as in claim 1, wherein the beam springs are copper.

6. A heat sink assembly used with a multi-chip module having a substrate and a plurality of integrated circuits mounted on the substrate, the heat sink assembly comprising:
    a heat sink;
    a thermal interface between the integrated circuits and the heat sink, operative to conduct heat from the integrated circuits to the heat sink;
    mechanical bias means urging the substrate toward the heat sink and thereby pressing a non-input/output side of the integrated circuits against the heat sink via the thermal interface with a force that remains substantially constant regardless of any thermal expansion or contraction of any of the substrate, the integrated circuits and the heat sink; and
    a base plate and a fastener fastening the base plate to the heat sink,
    wherein the base plate and the heat sink define therebetween a cavity enclosing the multi-chip module, the thermal interface and the mechanical bias means.

7. A heat sink assembly as in claim 6 and further comprising a flat flexible cable extending between the base plate and the heat sink to establish electrical communications between the multi-chip module and an external circuit.

8. A heat sink assembly as in claim 6 wherein the at least one mechanical spring bias means comprises a beam spring operative to exert an expansive force between the substrate and the base plate.

9. A heat sink assembly as in claim 6, wherein the thermal interface comprises a layer of thermal grease having a thickness of about 0.2 mm.

10. A heat sink assembly as in claim 6, wherein the mechanical bias means consists essentially of a pair of beam springs.

11. A heat sink assembly as in claim 10, wherein the beam springs are copper.

12. A heat sink assembly, comprising
    a heat sink having a cavity formed therein;
    a multi-chip module contained within the cavity, the multi-chip module having a substrate and a plurality of integrated circuits, the integrated circuits having a top side and an underside, the integrated circuits being mounted on the substrate using solder bumps between the underside of the integrated circuits and the substrate;
    a thermal interface between the top side of the integrated circuits and the heat sink, operative to conduct heat from the integrated circuits to the heat sink;

at least one pair of beam springs urging the substrate toward the heat sink, thereby pressing the top side of the integrated circuits against the heat sink via the thermal interface with a force that remains substantially constant regardless of any thermal expansion or contraction of any of the substrate, the integrated circuits and the heat sink.

13. A heat sink assembly as in claim 12, wherein the thermal interface comprises a layer of thermal grease having a thickness of about 0.2 mm.

14. A heat sink assembly as in claim 12, wherein the beam springs are copper.

* * * * *